(12) United States Patent
Ferreira, II et al.

(10) Patent No.: US 10,673,157 B1
(45) Date of Patent: Jun. 2, 2020

(54) CONNECTOR FRAME

(71) Applicant: Microsoft Technology Licensing, LLC, Redmond, WA (US)

(72) Inventors: Joseph Edward Ferreira, II, Seattle, WA (US); Todd David Pleake, Sammamish, WA (US); Mohammed Nadir Haq, Brier, WA (US); Christopher John Allen, Seattle, WA (US); Alexander Georges-Norbert Wood, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/267,235

(22) Filed: Feb. 4, 2019

Related U.S. Application Data

(60) Provisional application No. 62/775,274, filed on Dec. 4, 2018.

(51) Int. Cl.
   *H01R 12/71* (2011.01)
   *H01R 12/70* (2011.01)

(52) U.S. Cl.
   CPC ....... *H01R 12/716* (2013.01); *H01R 12/7076* (2013.01); *H01R 12/7082* (2013.01);
   (Continued)

(58) Field of Classification Search
   CPC .............. H01R 12/716; H01R 12/7076; H01R 12/7082
   (Continued)

(56) References Cited

U.S. PATENT DOCUMENTS

| 5,398,169 A | * | 3/1995 | Gorenz, Jr. | .......... | H05K 1/0215 |
|---|---|---|---|---|---|
| | | | | | 174/384 |
| 5,712,766 A | * | 1/1998 | Feldman | ................ | H01R 23/70 |
| | | | | | 361/728 |

(Continued)

FOREIGN PATENT DOCUMENTS

| CN | 203014076 U | 6/2013 |
|---|---|---|
| CN | 204835065 U | 12/2015 |

(Continued)

OTHER PUBLICATIONS

"Right Angle SMT Top Board Mount Push Pull No Ejection MicroSD Connector", Retrieved <<https://www.futureelectronics.com/p/7014123>>, Retrieved on: Nov. 21, 2018, 3 Pages.

(Continued)

*Primary Examiner* — Alexander Gilman
(74) *Attorney, Agent, or Firm* — Alleman Hall Creasman & Tuttle LLP

(57) ABSTRACT

Examples are disclosed that relate to PCB-based connectors and connector frames for a PCB. In one example, a connector frame comprises a cavity configured to house the PCB, the cavity defined at least partially by a first sidewall, a second sidewall opposite to the first sidewall, and an end wall extending between the first sidewall and the second sidewall. A support surface is adjacent to the cavity on a top side of the connector frame and extends between the first sidewall and the second sidewall. An aperture on the top side of the connector frame is formed at least partially by an edge of the support surface, with the aperture exposing a portion of the cavity through the top side.

20 Claims, 8 Drawing Sheets

(52) U.S. Cl.
CPC .............. *H05K 2201/10189* (2013.01); *H05K 2201/2018* (2013.01)

(58) Field of Classification Search
USPC .......................................................... 439/55
See application file for complete search history.

(56) References Cited

U.S. PATENT DOCUMENTS

| | | | | | |
|---|---|---|---|---|---|
| 5,846,092 | A * | 12/1998 | Feldman | .............. | G06K 19/077 439/76.1 |
| 6,563,701 | B1 * | 5/2003 | Peng | ................. | G06F 1/184 361/679.33 |
| 6,676,419 | B1 * | 1/2004 | Lin | ................. | G06K 19/077 439/131 |
| 7,040,908 | B2 * | 5/2006 | Kamata | .............. | H01R 13/6335 439/159 |
| 7,466,556 | B2 * | 12/2008 | Hiew | ................. | G06F 12/1416 361/736 |
| 7,529,084 | B2 * | 5/2009 | Liao | ................. | G11B 17/043 361/679.39 |
| 7,771,231 | B2 * | 8/2010 | Kim | ................. | G06K 7/0021 439/541.5 |
| 8,154,862 | B2 * | 4/2012 | Lai | ................... | G06F 1/187 361/679.33 |
| 8,164,896 | B1 * | 4/2012 | Wang | ................ | G06F 1/1658 361/679.33 |
| 8,461,465 | B2 * | 6/2013 | Golko | ................. | H01R 13/516 174/359 |
| 8,734,169 | B2 * | 5/2014 | Werner | .............. | H01R 12/7047 29/825 |
| 8,827,749 | B2 * | 9/2014 | Kim | ................. | G06K 7/0043 439/629 |
| 8,976,533 | B2 * | 3/2015 | Lin | ................. | H01L 25/00 361/679.31 |
| 9,466,929 | B2 * | 10/2016 | Wu | ................. | H01R 24/60 |
| 9,640,885 | B2 * | 5/2017 | Amini | ................ | H01R 12/73 |
| 2004/0100761 | A1 * | 5/2004 | Liu | ................. | G06F 1/184 361/679.33 |
| 2009/0258513 | A1 * | 10/2009 | Wu | ................. | H01R 13/629 439/78 |
| 2011/0003493 | A1 * | 1/2011 | Mo | ................. | H01R 27/00 439/81 |
| 2013/0273768 | A1 * | 10/2013 | Peng | ................ | H01R 13/629 439/374 |

FOREIGN PATENT DOCUMENTS

| | | |
|---|---|---|
| EP | 2706619 A2 | 3/2014 |
| WO | 2018058059 A1 | 3/2018 |

OTHER PUBLICATIONS

"USB 3.0 Connector PCB Pad SMT", Retrieved <<https://sze-conn.en.made-in-china.com/product/jsNnLlyCyakX/China-USB-3-0-Connector-PCB-Pad-SMT.html>>, Retrieved on: Nov. 21, 2018, 7 Pages.

"International Search Report and Written Opinion Issued in PCT Application No. PCT/US2019/063131", dated Mar. 3, 2020, 10 Pages.

* cited by examiner

US 10,673,157 B1

CONNECTOR FRAME

CROSS REFERENCE TO RELATED APPLICATIONS

This application claims priority to U.S. Provisional Patent Application Ser. No. 62/775,274, filed Dec. 4, 2018, and entitled "CONNECTOR FRAME", the entirety of which is hereby incorporated herein by reference for all purposes.

BACKGROUND

Forming an electrical connector from a printed circuit board (PCB) may increase signal integrity of the connector and provide a pleasing industrial design. However, common types of PCB materials may suffer from limited cyclical wear properties.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to PCB-based connectors and connector frames for a PCB. In one example, a connector frame comprises a cavity configured to house the PCB, the cavity defined at least partially by a first sidewall, a second sidewall opposite to the first sidewall, and an end wall extending between the first sidewall and the second sidewall. A support surface is adjacent to the cavity on a top side of the connector frame and extends between the first sidewall and the second sidewall. An aperture on the top side of the connector frame is formed at least partially by an edge of the support surface, with the aperture exposing a portion of the cavity through the top side.

Another example provides a method of manufacturing a PCB-based connector that comprises providing a connector frame. The connector frame comprises a cavity configured to house the PCB, the cavity defined at least partially by a first sidewall, a second sidewall opposite to the first sidewall, and an end wall extending between the first sidewall and the second sidewall. A support surface is adjacent to the cavity on a top side of the connector frame and extends between the first sidewall and the second sidewall. An aperture on the top side of the connector frame is formed at least partially by an edge of the support surface, with the aperture exposing a portion of the cavity through the top side. The method further comprises inserting the PCB into the cavity of the connector frame.

DETAILED DESCRIPTION

Forming an electrical connector from a PCB may increase signal integrity of the connector and provide a simplified, pleasing industrial design. However, common types of PCB materials may suffer from limited cyclical wear properties.

Some types of connectors may be frequently inserted and removed from a receptacle. For example, various types of USB connectors may be frequently inserted into and removed from USB ports. In a similar manner and in other examples, a connector may be located within a receptacle, and such connectors may be frequently connected to and disconnected from a corresponding plug.

Traditional materials used to form such connectors may include resilient plastics and metals that are designed to withstand the wear associated with frequent cyclical use. For example, many connectors may utilize a hard plastic/metallic housing that substantially encloses and protects the PCB from damage. On the other hand, typical PCB materials may be structurally less robust than materials typically used to form connectors. As a result, a connector that is simply a PCB may be susceptible to structural damage and failure.

Accordingly, and in one potential advantage of the present disclosure, a connector frame may enclose at least portions of a PCB and protect the PCB from damage and wear, while also providing a connector with increased signal integrity and a pleasing, low-profile appearance. In this manner, PCB-based connectors may be formed with robust wear characteristics corresponding to traditional connectors. Further, as described in more detail below, the connector frame may provide grounding when using PCBs as a connector base.

Figure 1:
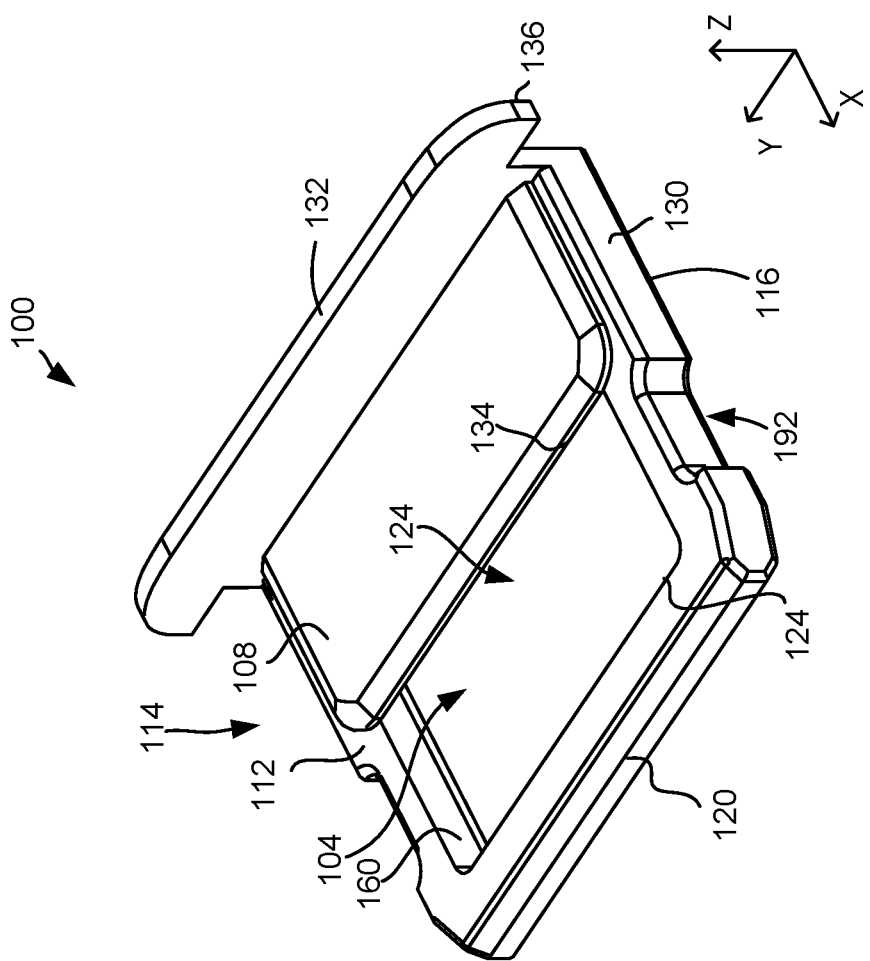
FIG. 1 shows a top perspective view of a connector frame according to examples of the present disclosure.
Figure 2:
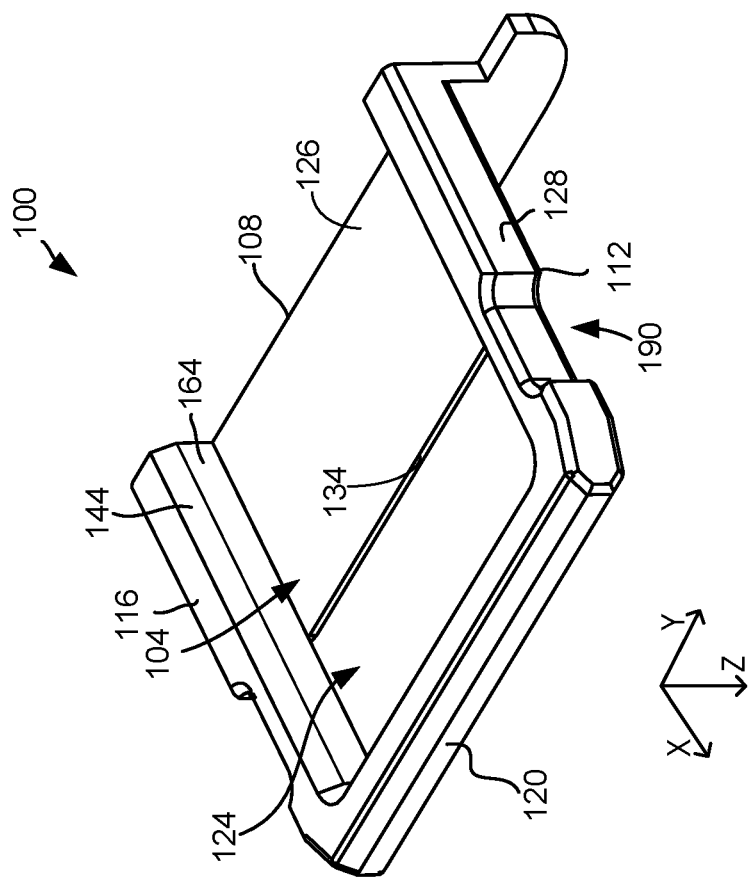
FIG. 2 shows a bottom perspective view of the connector frame of FIG. 1.
Figure 3:
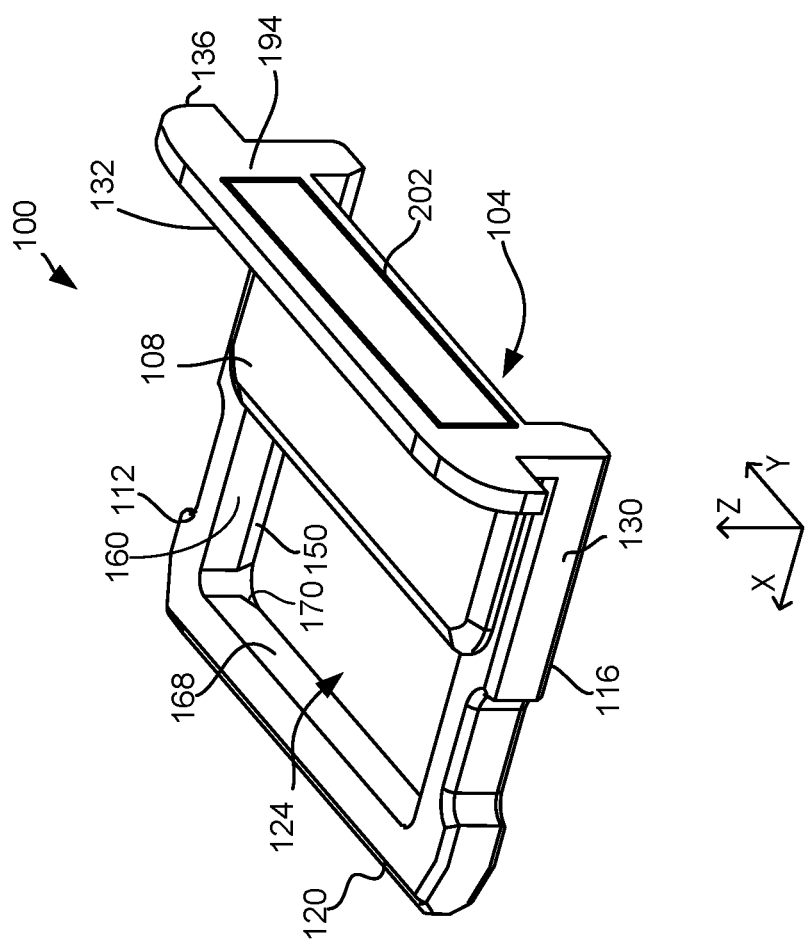
FIG. 3 shows another top perspective view of the connector frame of FIG. 1.
Figure 4:
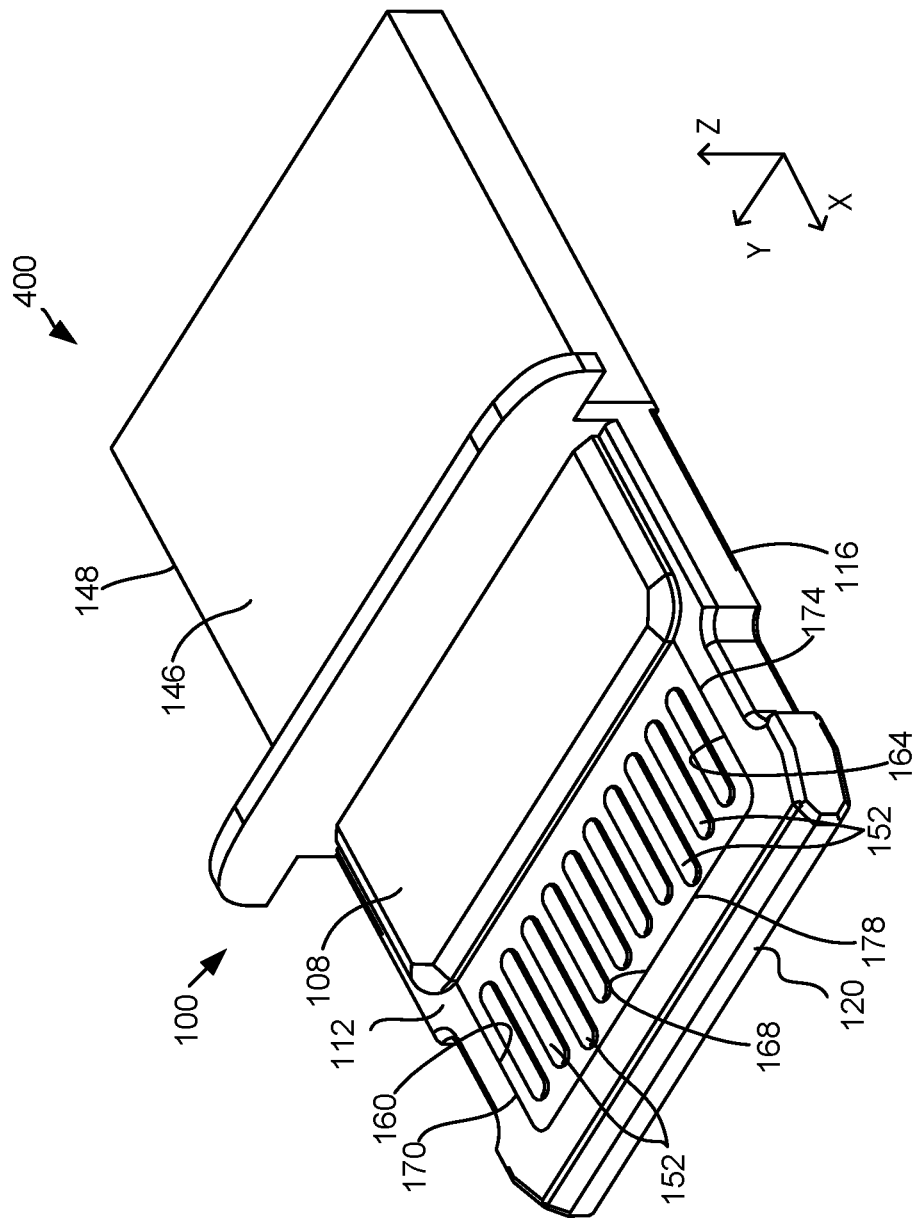
FIG. 4 illustrates a top perspective view of a PCB-based connector comprising a PCB and the connector frame of FIG. 1.

FIGS. 1-3 illustrate one example of a connector frame 100 for a PCB-based connector according to examples of the present disclosure. The connector frame 100 comprises a cavity 104 configured to house a PCB and defined at least partially by components configured to surround and capture a front end portion of the PCB. In the present example, the connector frame 100 also comprises a support surface 108 adjacent to the cavity 104 on a top side 114 of the connector frame 100. With reference also to FIG. 4, the support surface 108 may be configured to be adjacent to a front portion of a top side 146 of a PCB 148 when the PCB 148 is housed in the connector frame 100. More particularly and with reference also to FIG. 2, an underside 126 of the support surface 108 may be in contact with or closely adjacent to the portion of the top side 146 of the PCB 148 that is rearward from top side contacts 152 (see also FIG. 4). In this manner, the connector frame 100 may partially house the PCB connector within a protective enclosure. One example of a PCB-based connector including the connector frame 100 is described in more detail below with reference to FIGS. 4 and 5.

It will be appreciated that the connector frame 100 may be formed from any material suitable to protect the PCB from cyclical wear. Some examples of suitable materials may include, but are not limited to, various metals such as stainless steel, metal alloys, plastic resins, and the like. In other examples, the connector frame 100 may comprise softer materials or sacrificial materials. In some examples, the materials comprising the connector frame 100 may be colored or may be easily dyed or painted to a specified color.

With reference again to FIG. 1, the connector frame 100 comprises structures configured to protect a PCB from wear. For example, outer edges of a PCB may more susceptible to damage and wear. Accordingly, the connector frame 100 includes protective sides and an end portion configured to protect the edges of the PCB.

Figure 5:
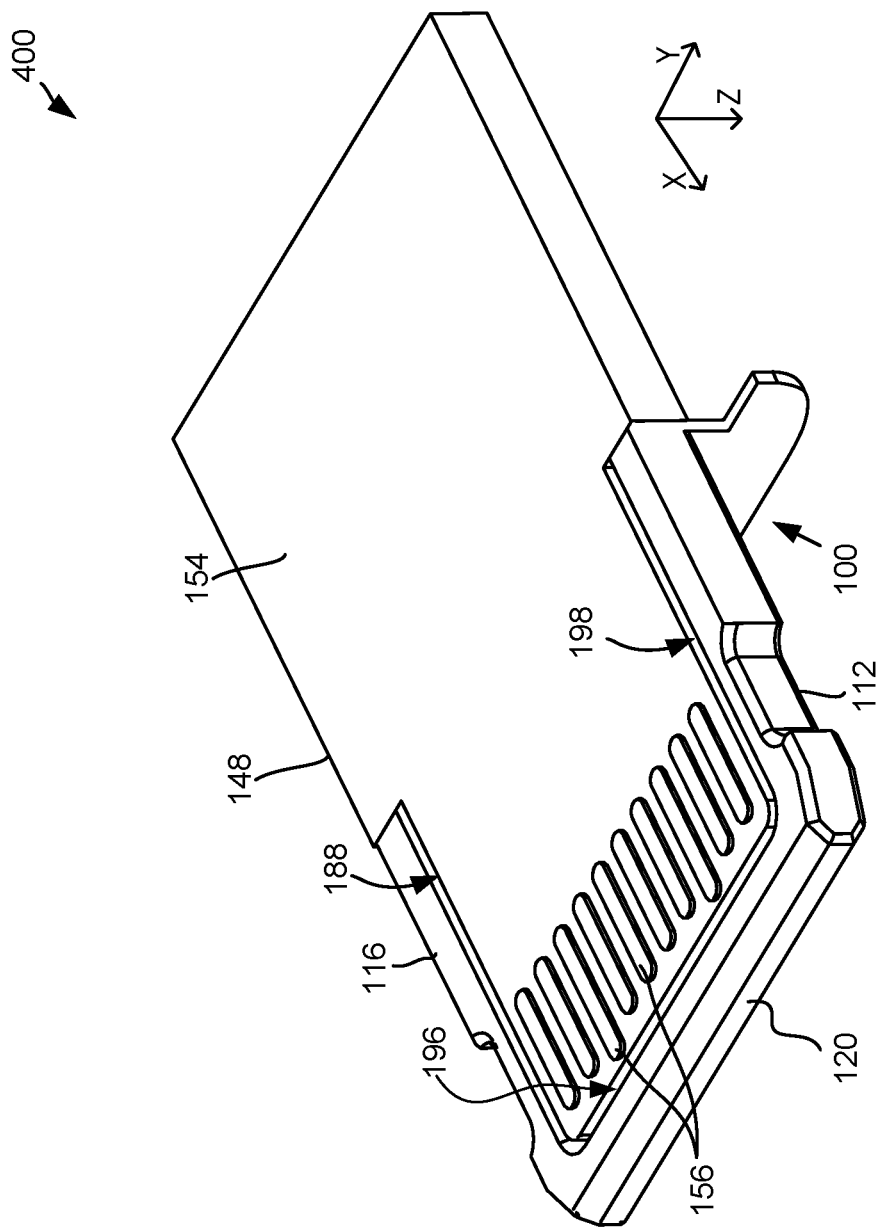
FIG. 5 shows a bottom perspective view of the PCB-based connector of FIG. 4.

In the example of FIGS. 1-3, connector frame 100 includes a first side 112, a second side 116 opposite to the first side 112, and an end 120 extending between the first side 112 and the second side 116. In some examples, the first side 112 may be parallel to the second side 116, and the end may extend perpendicularly to the first and second sides. The first side 112 comprises a first inner sidewall 160, the second side 116 comprises a second inner sidewall 164, and the end 120 comprises an inner end wall 168. Together, the first inner sidewall 160, second inner sidewall 164 and end wall 168 define the cavity 104 configured to house the PCB. As shown in FIGS. 4 and 5, the cavity 104 receives a front portion of the PCB 148. Additionally and as described in more detail below, this configuration conveniently enables the connector frame 100 to be quickly inserted over the PCB using surface mount assembly processes, such as pick-and-place.

In the present example, the first inner sidewall 160, second inner sidewall 164 and end wall 168 form a three-sided enclosure around the portion of the PCB 148 retained within the cavity 104. In this manner, the first inner sidewall 160, second inner sidewall 164 and end wall 168 operate to protect the edges of the PCB from contact and possible damage, thereby providing increased resistance to wear and extending a usable lifetime of the PCB-based connector.

To expose a forward portion of the top side of a PCB through the connector frame 100, the connector frame comprises an aperture 124 formed by a leading edge 134 of the support surface 108 and portions of the first side 112, end 120, and second side 116. In this example, the aperture 124 is substantially rectangular. With reference also to FIG. 4, the aperture 124 may be configured to expose a portion of the cavity 104 through the top side the connector frame 100, and thereby expose top side contacts 152 of the PCB. In the example of FIG. 1, the aperture 124 is adjacent to the support surface 108 and exposes the cavity 104 between the first side 112, the second side 116, the end 120, and the support surface 108.

The connector frame 100 may also include other structures configured to improve usability. For example, the connector frame 100 may be designed in accordance with one or more specifications and/or protocols related to connection, communication and/or power supply between devices. In one example, the connector frame 100 may be designed to accommodate a PCB configured for the USB-C standard, such that the PCB may serve as a USB-C connector when housed in the connector frame 100. Accordingly, the connector frame 100 may comprise features configured to engage with USB-C-type receptacles and/or plugs.

For example, as shown in FIGS. 1 and 2, the connector frame 100 may include notches extending into a body of the connector frame 100. In the example of FIGS. 1 and 2, connector frame 100 comprises a first notch 190 extending into the first side 112 and a second notch 192 extending into the second side 116 of the connector frame 100. The notches 190, 192 may be configured to serve as an interface for other connectors. For example, a USB-type connector may comprise one or more latches configured to engage one or more of the notches 190 when plugged into the connector frame 100, thereby securing the connectors together.

In some examples, the notches 190, 192 and/or any other suitable part of the connector frame 100 may be conductive or may include conductive components configured to provide electrical connections, such as grounding paths for the PCB-based connector. For example, one or more components of the connector frame, such as the support surface 108, the first side 112, or the second side 116, may replace grounding locations found in other connectors. In this manner, the connector frame 100 may provide grounding paths which may not otherwise be available using PCBs.

As shown in FIG. 1, the connector frame 100 may also include a ridge 132 on the top side of the connector frame 100 extending above the support surface 108. In some examples, the ridge 132 may include one or more tabs 136 extending beyond outer walls 128, 130 of the first side 112 and the second side 116, respectively. Additional details regarding the ridge 132 and the tabs 136 are described below with reference to FIG. 3.

As shown in FIG. 2, the connector frame 100 comprises an open face on its bottom side. For example, the connector frame 100 may not have a support surface or other structure enclosing the bottom side of the connector frame 100. In this manner, the PCB or other connector may be easily inserted into the connector frame 100 through the bottom side via the open face. In some examples, the connector frame 100 may be quickly and easily inserted over the PCB during a surface mount stage of assembling the PCB-based connector. In some examples, this process may be automated using a robotic pick-and-place machine to further increase connector assembly speed and reduce manufacturing costs. Absence of protruding structures from the bottom side may also favorably reduce the size of the connector frame 100.

Further, the first side 112, the second side 116, and the end 120 may comprise one or more rounded, sloped, chamfered, or other suitably configured surfaces to improve manufacturability. As best seen in FIGS. 2 and 3, the second inner sidewall 164 may comprise a chamfered edge 144 along a bottom side of the connector frame 100. Similarly, the first inner sidewall 160 may comprise a chamfered edge 150, and the end wall 168 may comprise a chamfered edge 170. In this manner, the connector frame 100 may be easily inserted over the PCB during assembly.

As described above, the connector frame 100 may be placed over the PCB using a robotic pick-and-place machine. In some examples, this may be accomplished by the same machine that places other components on the PCB during manufacturing. In some examples, the connector frame 100 may be aligned in a biased or jigged manner against at least one edge of the PCB. Once the connector frame 100 is in place, in some examples, the connector frame 100 may be affixed to the PCB.

It will be appreciated that any suitable means may be used to affix the connector frame 100 to the PCB. For example, the connector frame 100 may be affixed to the PCB via an adhesive, by reflow soldering, or by welding the connector frame 100 to the PCB.

In some examples, a bottom side cover may be applied over the bottom side of the connector frame 100 to cover the open face. For example, a metal bottom side cover may be laser welded to the bottom side of the connector frame 100.

In this manner, the PCB may be protected from damage or wear though the open face on the bottom side of the connector frame 100.

With reference now to FIG. 3, a back end of the connector frame 100 may comprise an opening that enables the PCB to extend from within the cavity 104 through the back end of the connector frame 100 (see also FIG. 5). As illustrated in FIG. 3, the back end of the connector frame 100 may further comprise a backplane surface 194. In the example of FIG. 3, the backplane surface 194 comprises a planar surface that is perpendicular to a plane of the support surface 108.

In this example, a rear surface of the ridge 132 and the tabs 136 may comprise at least a portion of the backplane surface 194. In this manner, the backplane surface 194 may extend above the support surface 108 and beyond the outer walls 128, 130 of the first side 112 and the second side 116, respectively. In some examples, the backplane surface 194 may support the connector frame 100 against a chassis or other structure of a device in which the PCB-based connector is located or into which the PCB-based connector may be inserted.

In some examples, a gasket may be provided on the backplane surface 194 to form a seal between the connector frame 100 and the device, such as to electrically seal the connector frame 100 around the back end. In some examples, the gasket may be configured to provide a grounding path for the PCB-based connector. For example, the gasket may comprise a conductive silicone material configured to provide such a grounding connection. FIG. 3 illustrates one example of a gasket 202 on the backplane surface 194. In different examples, the gasket 202 may have other shapes and configurations.

With reference now to FIG. 4, one example of a PCB-based connector 400 comprising a PCB 148 with top side contacts 152 installed within frame 100 is provided. The PCB 148 is housed within the cavity 104 of the connector frame 100 as described above. As illustrated in FIG. 4, the PCB 148 may be housed in the connector frame 100 such that the underside 126 of the support surface 108 (See FIG. 2) may be adjacent to a portion of the top side 146 of the PCB 148. In some examples, the underside 126 is in contact with the surface of the PCB 148 to provide additional structural integrity to the connector 400. In addition, in this example a front first side 170 of the PCB 148 is contacting the first sidewall 160 of the first side 112 of connector frame 100. Similarly, a front second side 174 of the PCB 148 is contacting the second sidewall 164 of the second side 116, and a front end 178 of the PCB 148 is contacting the inner end wall 168. In this manner, the PCB 148 may be securely retained within connector frame 100 to form PCB-based connector 400.

Also as illustrated in FIG. 4, the aperture 124 may expose a front portion of the PCB 148 through the top side of the connector frame 100. In this manner, the top side contacts 152 of the PCB 148 may be exposed through the aperture 124. Further, and with reference now to FIG. 5, the PCB 148 may also comprise bottom side contacts 156 on a bottom side 154 of the PCB 148 opposite the top side. As shown in FIG. 5, the PCB 148 and bottom side contacts 156 may be exposed in the open face on the bottom side of the connector frame 100. In this example, the chamfered edges 144, 150, and 170 described above create small gaps 188, 196, 198 between the surfaces of these edges and the PCB 148.

Accordingly and as described above, the PCB-based connector 400 utilizes the configuration of the connector frame 100 to protect PCB 148 from wear and potential damage, while also providing an aesthetically pleasing design that facilitates faster assembly and reduces manufacturing costs.

Figure 6:
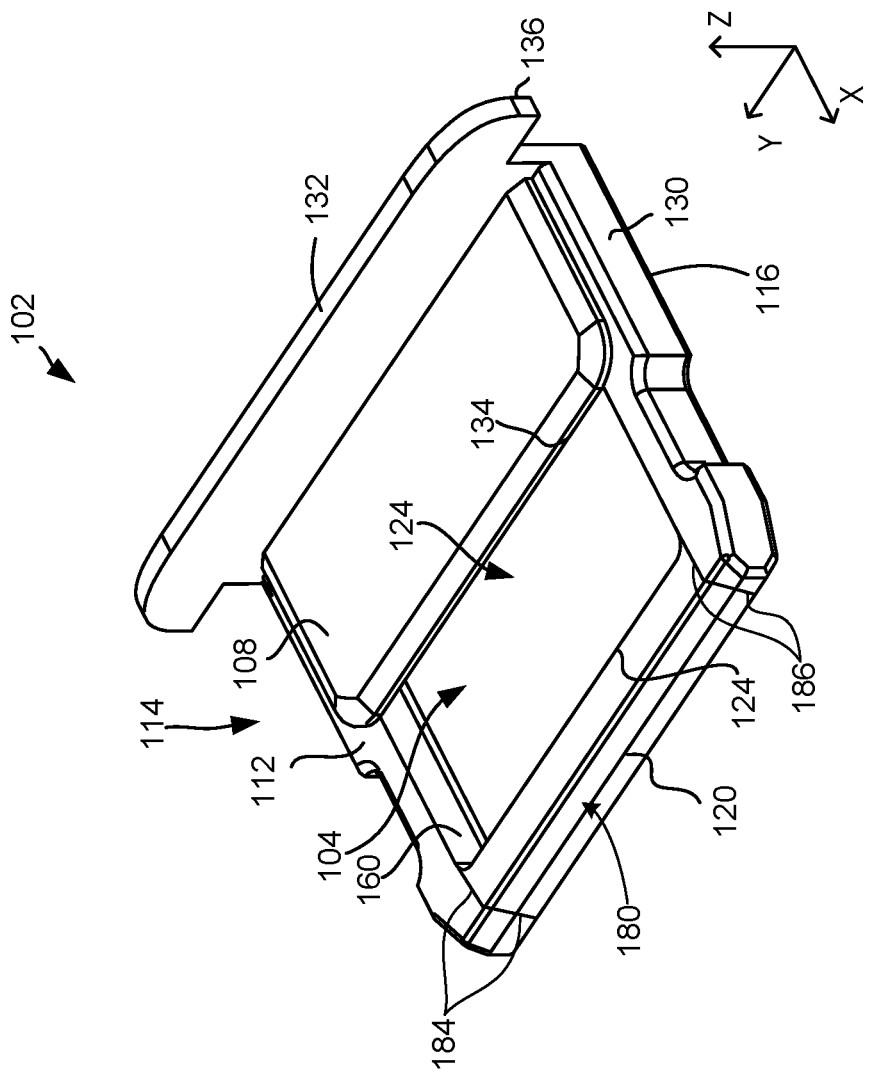
FIG. 6 shows a top perspective view of a connector frame according to another example of the present disclosure.
Figure 7:
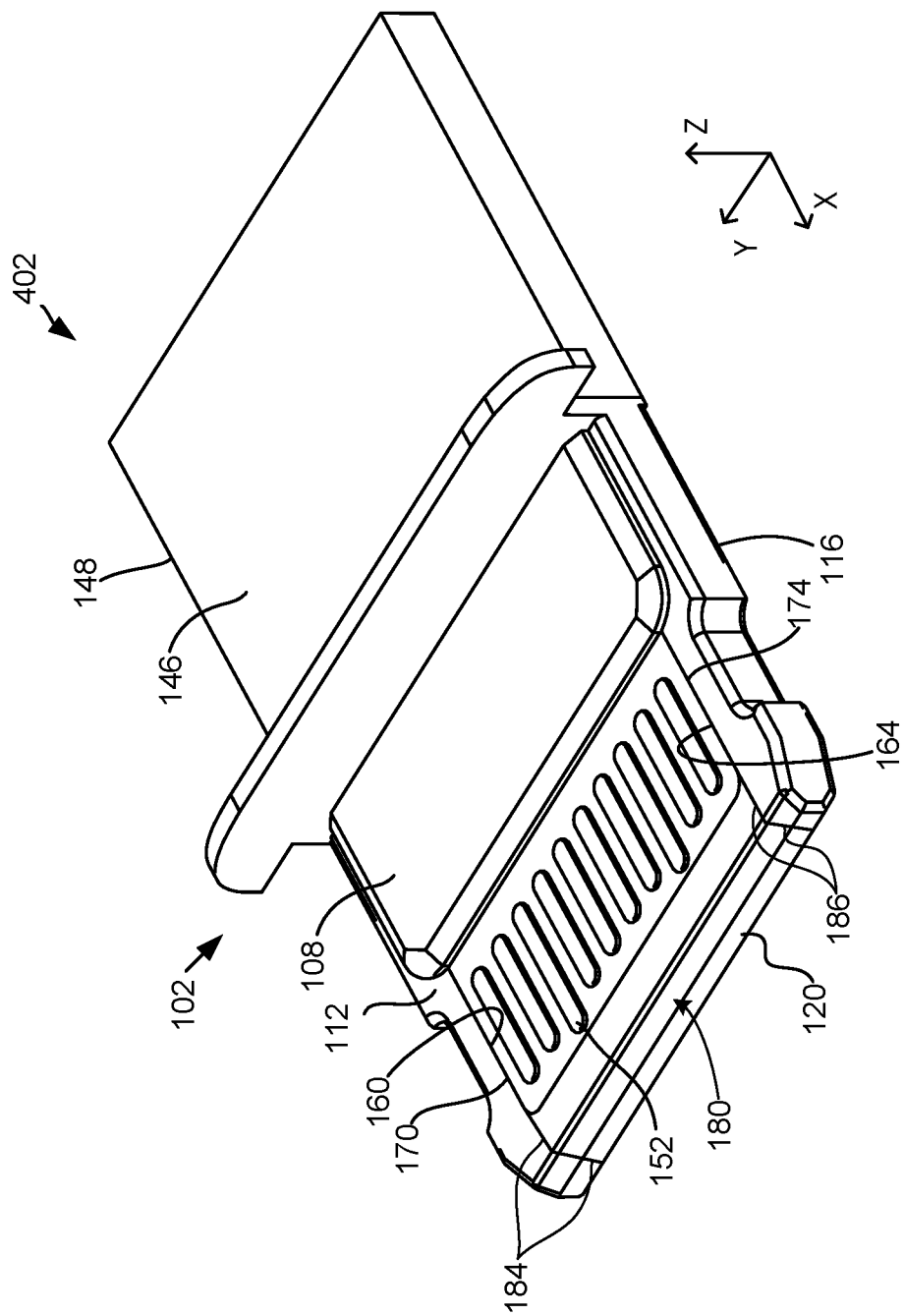
FIG. 7 shows a top perspective view of another example of a PCB-based connector comprising a PCB and the connector frame of FIG. 6.

With reference now to FIGS. 6 and 7, in some examples at least a portion of the end of a connector frame/PCB-based connector may be non-conductive. In the example of FIGS. 6 and 7, a connector frame 102/PCB-based connector 402 comprises an end 120 that includes a non-conductive portion 180 located between boundary lines 184 and 186. In other examples, the non-conductive portion may extend beyond these lines and further along the first side 112 and second side 116. In different examples, the non-conductive portion may comprise a plastic component, non-conductive cover, non-conductive film, and/or other non-conductive materials. Advantageously and in these examples, the non-conductive portion 180 may allow the power contacts from a corresponding receptacle or plug to contact the non-conductive portion 180 of the end 120 when the PCB-based connector 402 is removed from the receptacle or disconnected from the plug. In this manner, the PCB-based connector 402 may prevent these corresponding power contacts from contacting a conductive portion of the end 120, which could potentially cause a short circuit.

Figure 8:
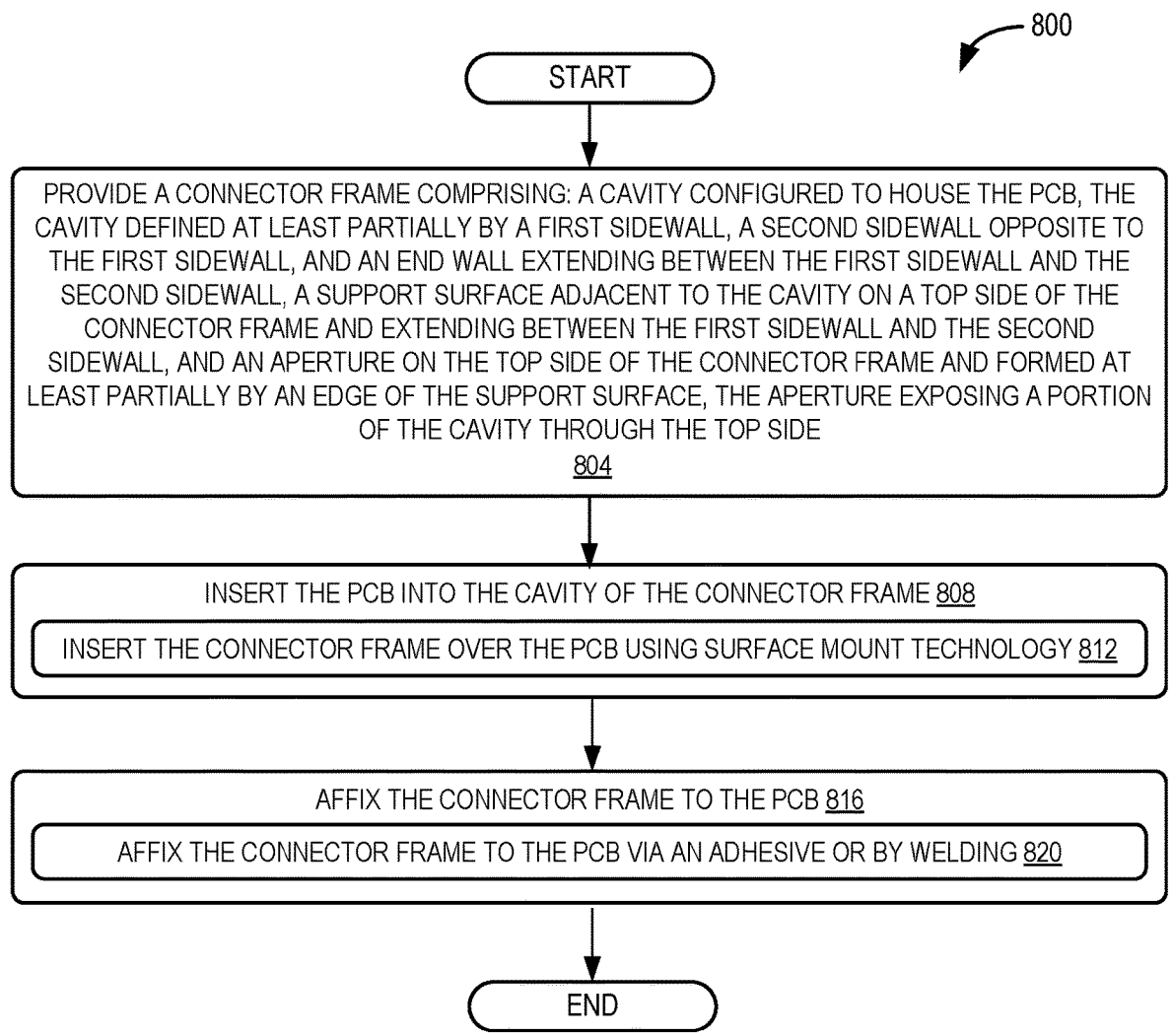
FIG. 8 is a block diagram of a method for manufacturing a PCB-based connector according to examples of the present disclosure.

With reference now to FIG. 8, a flow diagram is provided depicting an example method 800 for manufacturing a PCB-based connector. The following description of method 800 is provided with reference to the components described herein and shown in FIGS. 1-7. It will be appreciated that method 800 also may be performed in other contexts using other suitable components.

At 804, the method 800 includes providing a connector frame comprising a cavity configured to house the PCB, the cavity defined at least partially by a first sidewall, a second sidewall opposite to the first sidewall, and an end wall extending between the first sidewall and the second sidewall, a support surface adjacent to the cavity on a top side of the connector frame and extending between the first sidewall and the second sidewall, and an aperture on the top side of the connector frame and formed at least partially by an edge of the support surface, the aperture exposing a portion of the cavity through the top side. At 808, the method 800 includes inserting the PCB into the cavity of the connector frame. At 812, the method 800 may include inserting the connector frame over the PCB using surface mount technology. At 816, the method 800 may include affixing the connector frame to the PCB. At 820, the method 800 may include affixing the connector frame to the PCB via an adhesive or by laser welding.

The following paragraphs provide additional support for the claims of the subject application. One aspect provides a connector frame for a printed circuit board (PCB), the connector frame comprising: a cavity configured to house the PCB, the cavity defined at least partially by a first sidewall, a second sidewall opposite to the first sidewall, and an end wall extending between the first sidewall and the second sidewall; a support surface adjacent to the cavity on a top side of the connector frame and extending between the first sidewall and the second sidewall; and an aperture on the top side of the connector frame and formed at least partially by an edge of the support surface, the aperture exposing a portion of the cavity through the top side.

The connector frame may additionally or alternatively include, wherein the aperture is configured to expose one or more contacts of the PCB through the top side when the PCB is retained within the cavity. The connector frame may additionally or alternatively include a first notch extending into the first sidewall and a second notch extending into the second sidewall. The connector frame may additionally or alternatively include, wherein the notches provide a grounding path for the PCB.

The connector frame may additionally or alternatively include a ridge on the top side of the connector frame extending above the support surface. The connector frame may additionally or alternatively include, wherein the ridge comprises at least a portion of a backplane surface at a back end of the connector frame.

The connector frame may additionally or alternatively include, wherein each of the first sidewall and the second sidewall comprise a chamfered edge along a bottom side of the connector frame. The connector frame may additionally or alternatively include, wherein each of the chamfered edges is configured to create a gap between a surface of the chamfered edge and the PCB.

The connector frame may additionally or alternatively include, wherein the end wall comprises a non-conductive portion. The connector frame may additionally or alternatively include, wherein the non-conductive portion comprises one or more of a plastic component, a non-conductive cover, or a non-conductive film.

Another aspect provides a connector comprising: a printed circuit board (PCB) having one or more contacts; and a connector frame comprising: a cavity housing the PCB, the cavity defined at least partially by a first sidewall, a second sidewall opposite to the first sidewall, and an end wall extending between the first sidewall and the second sidewall; a support surface adjacent to the cavity on a top side of the connector frame and extending between the first sidewall and the second sidewall; and an aperture on the top side of the connector frame and formed at least partially by an edge of the support surface, the aperture exposing the one or more contacts of the PCB.

The connector may additionally or alternatively include a first notch extending into the first sidewall and a second notch extending into the second sidewall. The connector may additionally or alternatively include, wherein the notches provide a grounding path for the PCB.

The connector may additionally or alternatively include a ridge on the top side of the connector frame extending above the support surface. The connector may additionally or alternatively include, wherein the ridge comprises at least a portion of a backplane surface at a back end of the connector frame.

The connector may additionally or alternatively include, wherein each of the first sidewall and the second sidewall comprise a chamfered edge along a bottom side of the connector frame. The connector may additionally or alternatively include, wherein each of the chamfered edges creates a gap between a surface of the chamfered edge and the PCB.

The connector may additionally or alternatively include, wherein the end wall comprises a non-conductive portion. The connector may additionally or alternatively include, wherein the non-conductive portion comprises one or more of a plastic component, a non-conductive cover, or a non-conductive film.

Another aspect provides a method of manufacturing a printed circuit board (PCB)-based connector, the method comprising: providing a connector frame, wherein the connector frame comprises: a cavity configured to house the PCB, the cavity defined at least partially by a first sidewall, a second sidewall opposite to the first sidewall, and an end wall extending between the first sidewall and the second sidewall, a support surface adjacent to the cavity on a top side of the connector frame and extending between the first sidewall and the second sidewall, and an aperture on the top side of the connector frame and formed at least partially by an edge of the support surface, the aperture exposing a portion of the cavity through the top side; and inserting the PCB into the cavity of the connector frame.

It will be understood that the configurations and/or approaches described herein are exemplary in nature, and that these specific embodiments or examples are not to be considered in a limiting sense, because numerous variations are possible. The specific routines or methods described herein may represent one or more of any number of manufacturing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A connector frame for a printed circuit board (PCB), the connector frame comprising:
   a cavity configured to house the PCB, the cavity defined at least partially by a first sidewall, a second sidewall opposite to the first sidewall, and an end wall extending between the first sidewall and the second sidewall;
   a support surface adjacent to the cavity on a top side of the connector frame and extending between the first sidewall and the second sidewall; and
   an aperture on the top side of the connector frame and formed at least partially by an edge of the support surface and the end wall opposite to the edge of the support surface, the aperture exposing a portion of the cavity through the top side.

2. The connector frame of claim 1, wherein the aperture is configured to expose one or more contacts of the PCB through the top side when the PCB is retained within the cavity.

3. The connector frame of claim 1, further comprising a first notch extending into the first sidewall and a second notch extending into the second sidewall.

4. The connector frame of claim 3, wherein the notches provide a grounding path for the PCB.

5. The connector frame of claim 1, further comprising a ridge on the top side of the connector frame extending above the support surface.

6. The connector frame of claim 5, wherein the ridge comprises at least a portion of a backplane surface at a back end of the connector frame.

7. The connector frame of claim 1, wherein each of the first sidewall and the second sidewall comprise a chamfered edge along a bottom side of the connector frame.

8. The connector frame of claim 7, wherein each of the chamfered edges is configured to create a gap between a surface of the chamfered edge and the PCB.

9. The connector frame of claim 1, wherein the end wall comprises a non-conductive portion.

10. The connector frame of claim 9, wherein the non-conductive portion comprises one or more of a plastic component, a non-conductive cover, or a non-conductive film.

11. A connector comprising:
    a printed circuit board (PCB) having one or more contacts; and
    a connector frame comprising:

a cavity housing the PCB, the cavity defined at least partially by a first sidewall, a second sidewall opposite to the first sidewall, and an end wall extending between the first sidewall and the second sidewall;

a support surface adjacent to the cavity on a top side of the connector frame and extending between the first sidewall and the second sidewall; and an aperture on the top side of the connector frame and formed at least partially by an edge of the support surface and the end wall opposite to the edge of the support surface, the aperture exposing the one or more contacts of the PCB.

12. The connector of claim 11, further comprising a first notch extending into the first sidewall and a second notch extending into the second sidewall.

13. The connector of claim 12, wherein the notches provide a grounding path for the PCB.

14. The connector of claim 11, further comprising a ridge on the top side of the connector frame extending above the support surface.

15. The connector of claim 14, wherein the ridge comprises at least a portion of a backplane surface at a back end of the connector frame.

16. The connector of claim 11, wherein each of the first sidewall and the second sidewall comprise a chamfered edge along a bottom side of the connector frame.

17. The connector of claim 16, wherein each of the chamfered edges creates a gap between a surface of the chamfered edge and the PCB.

18. The connector of claim 11, wherein the end wall comprises a non-conductive portion.

19. The connector of claim 18, wherein the non-conductive portion comprises one or more of a plastic component, a non-conductive cover, or a non-conductive film.

20. A method of manufacturing a printed circuit board (PCB)-based connector, the method comprising:

providing a connector frame, wherein the connector frame comprises:

a cavity configured to house the PCB, the cavity defined at least partially by a first sidewall, a second sidewall opposite to the first sidewall, and an end wall extending between the first sidewall and the second sidewall, a support surface adjacent to the cavity on a top side of the connector frame and extending between the first sidewall and the second sidewall, and an aperture on the top side of the connector frame and formed at least partially by an edge of the support surface and the end wall opposite to the edge of the support surface, the aperture exposing a portion of the cavity through the top side; and inserting the PCB into the cavity of the connector frame.

* * * * *

UNITED STATES PATENT AND TRADEMARK OFFICE
CERTIFICATE OF CORRECTION

PATENT NO. : 10,673,157 B1
APPLICATION NO. : 16/267235
DATED : June 2, 2020
INVENTOR(S) : Joseph Edward Ferreira, II et al.

Page 1 of 1

It is certified that error appears in the above-identified patent and that said Letters Patent is hereby corrected as shown below:

In the Claims

In Column 8, Line 31, Claim 1, after "the second sidewall", insert --, the support surface configured to allow the PCB to be inserted into the cavity in a direction perpendicular to the support surface--

In Column 9, Line 7, Claim 11, after "the second sidewall", insert --, the support surface configured to allow the PCB to be inserted into the cavity in a direction perpendicular to the support surface--

In Column 10, Line 19, Claim 20, after "the second sidewall", insert --, the support surface configured to allow the PCB to be inserted into the cavity in a direction perpendicular to the support surface--

Signed and Sealed this
Twenty-eighth Day of July, 2020

Andrei Iancu
*Director of the United States Patent and Trademark Office*